United States Patent
Liu et al.

(10) Patent No.: US 9,728,719 B2
(45) Date of Patent: Aug. 8, 2017

(54) LEAKAGE RESISTANT RRAM/MIM STRUCTURE

(71) Applicant: Taiwan Semiconductor Manufacturing Co., Ltd., Hsin-Chu (TW)

(72) Inventors: Ming Chyi Liu, Hsinchu (TW); Yuan-Tai Tseng, Zhubei (TW); Shih-Chang Liu, Alian Township (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/261,526

(22) Filed: Apr. 25, 2014

(65) Prior Publication Data

US 2015/0311435 A1  Oct. 29, 2015

(51) Int. Cl.
*H01L 47/00* (2006.01)
*H01L 45/00* (2006.01)
*H01L 49/02* (2006.01)

(52) U.S. Cl.
CPC .......... *H01L 45/1253* (2013.01); *H01L 28/40* (2013.01); *H01L 45/08* (2013.01); *H01L 45/122* (2013.01); *H01L 45/1233* (2013.01); *H01L 45/1246* (2013.01); *H01L 45/146* (2013.01); *H01L 45/16* (2013.01)

(58) Field of Classification Search
CPC .. H01L 45/1253; H01L 45/1233; H01L 45/16
See application file for complete search history.

(56) References Cited

U.S. PATENT DOCUMENTS

| | | |
|---|---|---|
| 6,849,891 B1 | 2/2005 | Hsu et al. |
| 7,169,637 B2 | 1/2007 | Zhang et al. |
| 7,407,858 B2 | 8/2008 | Li et al. |
| 7,579,612 B2 | 8/2009 | Tang et al. |
| 7,795,606 B2 | 9/2010 | Jin et al. |
| 7,833,898 B2 | 11/2010 | Lee |

(Continued)

OTHER PUBLICATIONS

U.S. Appl. No. 14/156,505, filed Jan. 16, 2014.

*Primary Examiner* — Marc Armand
*Assistant Examiner* — Sarah Salerno
(74) *Attorney, Agent, or Firm* — Eschweiler & Potashnik, LLC

(57) ABSTRACT

An integrated circuit device includes a resistive random access memory (RRAM) cell or a MIM capacitor cell having a dielectric layer, a top conductive layer, and a bottom conductive layer. The dielectric layer includes a peripheral region adjacent an edge of the dielectric layer and a central region surrounded by the peripheral region. The top conductive layer abuts and is above dielectric layer. The bottom conductive layer abuts and is below the dielectric layer in the central region, but does not abut the dielectric layer the peripheral region of the cell. Abutment can be prevented by either an additional dielectric layer between the bottom conductive layer and the dielectric layer that is exclusively in the peripheral region or by cutting of the bottom electrode layer short of the peripheral region. Damage or contamination at the edge of the dielectric layer does not result in leakage currents.

20 Claims, 7 Drawing Sheets

(56) References Cited

U.S. PATENT DOCUMENTS

| | | | |
|---|---|---|---|
| 7,923,285 B2 | 4/2011 | Lai et al. | |
| 8,009,454 B2 | 8/2011 | Lee et al. | |
| 8,546,235 B2 * | 10/2013 | Huang | H01L 28/40 |
| | | | 438/393 |
| 8,896,096 B2 | 11/2014 | Tu et al. | |
| 2005/0212082 A1 * | 9/2005 | Takeda | H01L 28/40 |
| | | | 257/534 |
| 2007/0132049 A1 | 6/2007 | Stipe | |
| 2008/0001197 A1 * | 1/2008 | Kawakatsu | H01L 27/11 |
| | | | 257/296 |
| 2008/0124912 A1 * | 5/2008 | Liu | H01L 21/28273 |
| | | | 438/622 |
| 2009/0039332 A1 | 2/2009 | Lee et al. | |
| 2011/0136317 A1 * | 6/2011 | Kang | H01L 21/02183 |
| | | | 438/396 |
| 2012/0178210 A1 | 7/2012 | Lee et al. | |
| 2012/0241710 A1 | 9/2012 | Liu et al. | |
| 2013/0056850 A1 * | 3/2013 | Kume | H01L 27/10808 |
| | | | 257/532 |
| 2013/0161707 A1 | 6/2013 | Huang et al. | |

\* cited by examiner

LEAKAGE RESISTANT RRAM/MIM STRUCTURE

BACKGROUND

The present disclosure relates to integrated circuit devices with resistive random access memory or metal-insulator-metal capacitors, methods of making such devices, and methods of operating such devices.

Resistive random access memory (RRAM) has a simple structure, low operating voltage, high-speed, good endurance, and CMOS process compatibility. RRAM is a promising alternative to provide a downsized replacement for traditional flash memory and is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1".

In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again. RRAM cells are typically formed after front-end-of line (FEOL) processing. In a typical design, an array of RRAM cells is formed between a pair of metal interconnect layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
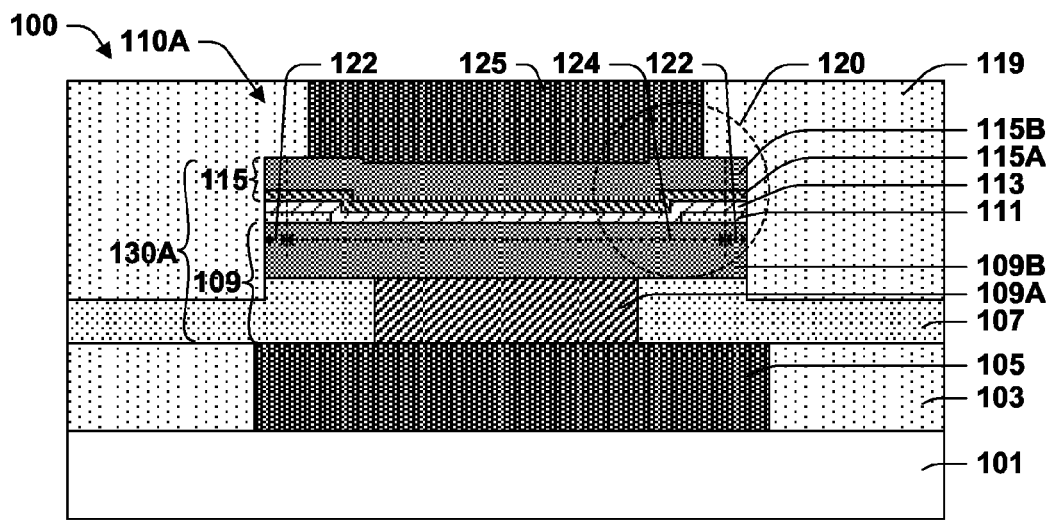
FIG. 1 is an illustration of an integrated circuit device providing an example in accordance with a first group of embodiments provided by the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It has been observed that an RRAM dielectric can be damaged or contaminated by etching and that this can lead to leakage currents through a peripheral region adjacent an outer edge of the RRAM dielectric layer. The present disclosure provides a method and resulting structures in which such leakage does not occur. The method modifies the structure of the RRAM cell stack to cause the separation between the top electrode and the bottom electrode to be substantially greater about a peripheral region of the top electrode in comparison to a minimum separation that occurs in a central region. In a first group of embodiments, the additional separation is created by forming an extra layer of dielectric in the peripheral region. In a second group of embodiments, the additional separation is created by cutting off the bottom electrode short of the peripheral region. In alternate embodies these method and structures are applied to form metal-insulator-metal (MIM) capacitors, which are generally similar in structure to RRAM cells.

Figure 2:
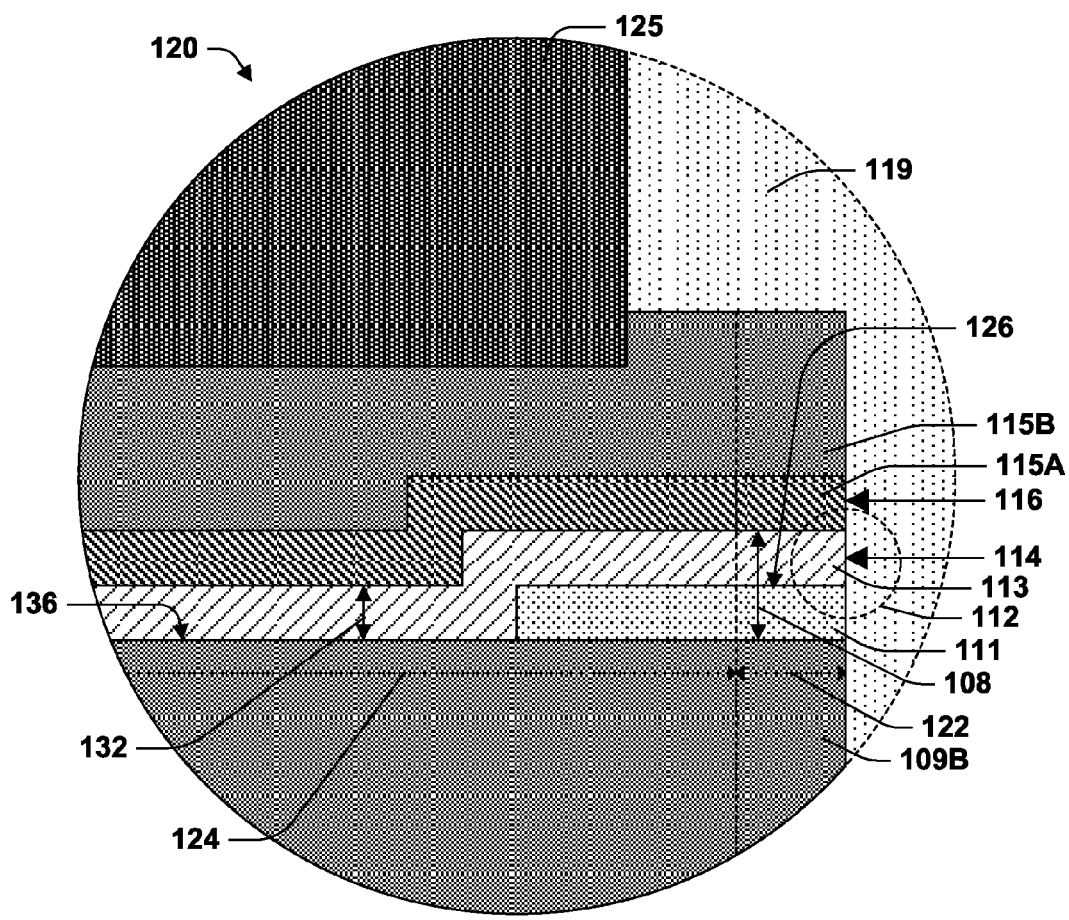
FIG. 2 is an expanded view of a portion of FIG. 1.

FIGS. 1 and 2 illustrate a metal-insulator-metal structure 110A in an integrated circuit device 100, which is an example within the first group of embodiments provided by the present disclosure. The metal-insulator-metal structure 110A is typically one cell in an array of similar cells. In some embodiments, the metal-insulator-metal structure 110A is an RRAM cell. In some other embodiments, the metal-insulator-metal structure 110A is an MIM capacitor. The device 100 includes a substrate 101 over which is formed a contact 105 within a matrix of dielectric 103. In most embodiments substrate 101 includes one or more metal interconnect layers formed over a semiconductor body.

Contact 105 can connect to a switching device for selecting metal-insulator-metal structure 110A. A switching device can be formed on the semiconductor body within substrate 101. In some embodiments the switching device is a transistor and the structure 110A is one in an array of RRAM cells having the 1T1R architecture. In some embodiments, the switching device is a diode and the structure 110A is one in an array of RRAM cells having the 1D1R architecture. In some embodiments, the switching device is a bipolar junction transistor and the structure 110A is one in an array of RRAM cells having the 1BJT1R architecture. In some embodiments, the switching device is a bipolar switch and the structure 110A is one in an array of RRAM cells having the 1S1R architecture. In some embodiments, there is no switching device and the structure 110A is one in an array of RRAM cells having the 1R architecture.

An RRAM/MIM (RRAM cell or MIM capacitor) stack 130A is formed over the contact 105. Contact 105 and dielectric 103 can be part of a metal interconnect layer formed over the substrate 101. In some embodiments, the structure 110A is an RRAM cell and contact 105 and dielectric 103 are part of the fourth (M4) metal interconnect layer. In some embodiments, an etch stop layer 107 is formed over the metal interconnect layer that includes contact 105. In those embodiments, etch stop layer 107 can include an opening over contact 105 that allows RRAM/MIM stack 130A to interface with contact 105.

RRAM/MIM stack 130A includes bottom electrode 109, a dielectric layer 113, which can be an RRAM dielectric, top electrode 115, and an additional dielectric layer 111. Bottom electrode 109 can include diffusion barrier layer 109A and main bottom electrode layer 109B. Top electrode 115 can include capping layer 115A and main top electrode layer 115B. RRAM/MIM stack 130A includes a central region 124 and a peripheral region 122. Additional dielectric layer 111 extends through peripheral region 122, but not through central region 124.

Top electrode 115 covers an upper surface of dielectric layer 113. Dielectric layer 113 covers an upper surface of bottom electrode 109. In some embodiments, top electrode 115 is coextensive with dielectric layer 113. In some embodiments, top electrode 115 and bottom electrode 109 shadow the same area of substrate 101.

FIG. 2 provides an expanded view of the region 120 identified in FIG. 1. As shown in FIG. 2, the distance 108, which is the shortest distance between any point on top electrode 115 within peripheral region 122 and any point on bottom electrode 109, is much greater than the shortest distance 132 between any point on top electrode 115 within central region 122 and bottom electrode 109. In some embodiments, the distance 108 is at least about twice the distance 132. In most embodiments, dielectric layer 111 has a lower dielectric constant than the material of dielectric layer 113. In most embodiments, the resistance along the shortest path 108 from top electrode 115 in peripheral region 122 to bottom electrode 109 is more than twice the resistance along the shortest path 132 from top electrode 115 in central region 124 to bottom electrode 109.

Dielectric layer 113 may be damaged or contaminated as a result of etching near an edge 114. Any such damage or contamination is restricted to an area 112 proximate edge 114 and will not significantly affect the performance of the device 100. The area 112 is entirely within peripheral region 122. Because of the greater electrode separation along pathways through peripheral region 122, leakage will not occur to any significant degree through peripheral region 122. In embodiments where structure 110A is an RRAM cell, conductive bridges will ordinarily not form through any portion of dielectric layer 113 that is in peripheral region 122. Conductive bridges will form exclusively within central region 124.

Figure 3:
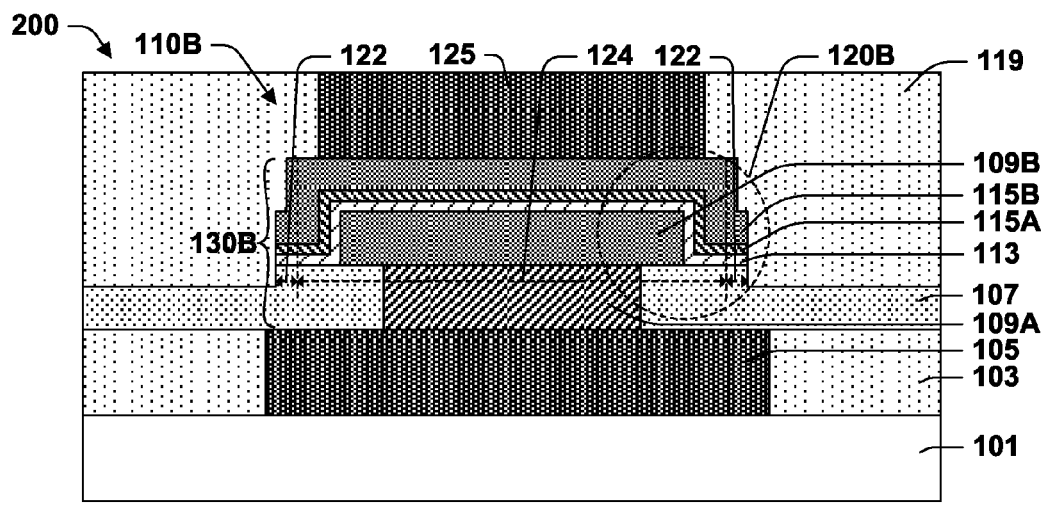
FIG. 3 is an illustration of an integrated circuit device providing an example in accordance with a second group of embodiments provided by the present disclosure.
Figure 4:
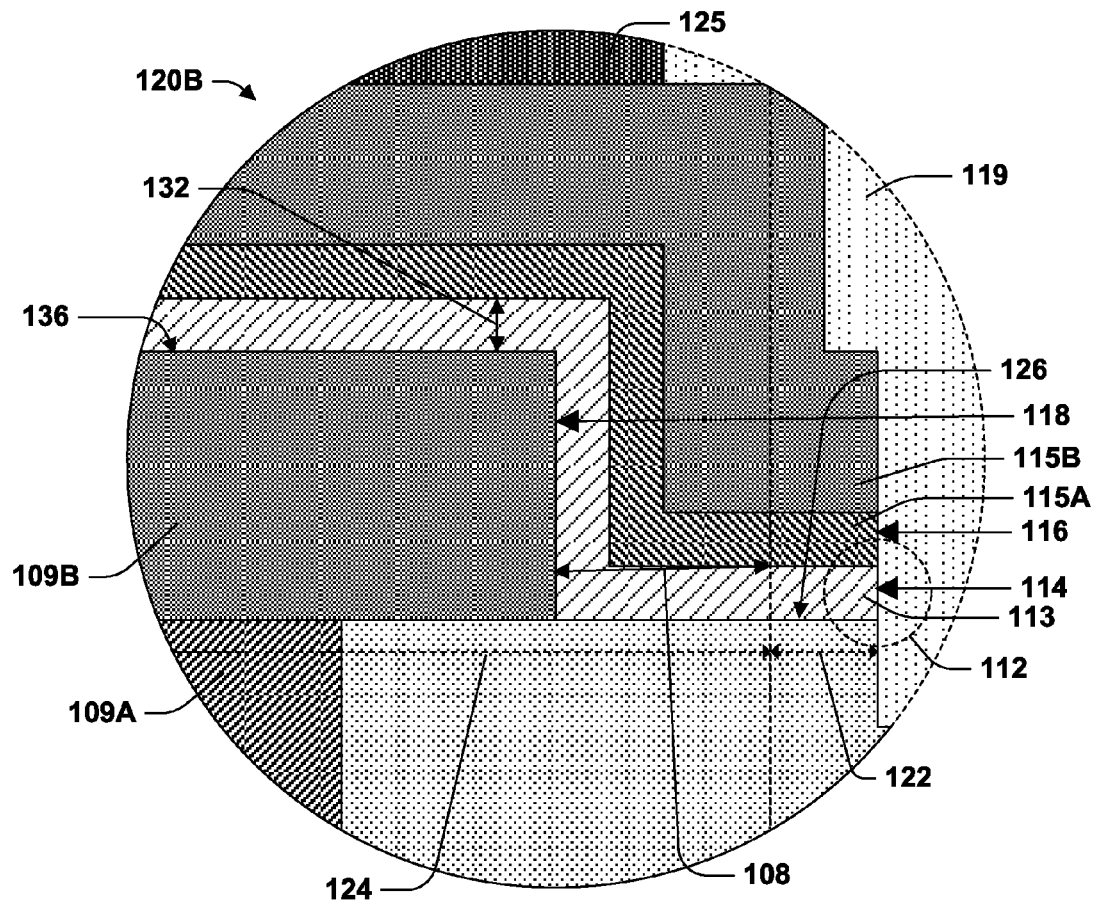
FIG. 4 is an expanded view of a portion of FIG. 3.

FIGS. 3 and 4 illustrate a metal-insulator-metal structure 110B in an integrated circuit device 200, which is an example within the second group of embodiments provided by the present disclosure. In some embodiments, the metal-insulator-metal structure 110B is an RRAM cell. In some other embodiments, the metal-insulator-metal structure 110B is an MIM capacitor. The description of integrated circuit device 100 and its embodiments applies to integrated circuit device 200 with two differences: additional dielectric layer 111 can be absent from metal-insulator-metal structure 110B and in metal-insulator-metal structure 110B, bottom electrode 109 is cut off short of peripheral region 122. As a consequence, in metal-insulator-metal structure 110B bottom electrode 109 lies exclusively within central region 124 and bottom electrode 109 shadows a smaller area of substrate 101 than top electrode 115. In most of these embodiments, dielectric 113 covers an edge surface 118 of bottom electrode as shown in FIG. 4.

FIG. 4 provides an expanded view of the region 120B identified in FIG. 3. As shown in FIG. 4, shortest distance 108 between top electrode 115 in peripheral region 122 and any point on bottom electrode 109 lies in a different direction for device 200 as compared to device 100, but distance 108 is still much greater than the shortest distance 132 within central region 122. Accordingly, device 200 achieves the same results as device 100.

As shown in FIGS. 2 and 4, in both structure 110A and 110B, the base 136 of dielectric layer 113 within central region 124 contacts bottom electrode 109, but the base 126 of dielectric layer 113 within peripheral region 122 does not. In embodiments represented by structure 110A, this is because additional dielectric layer 111 seperates dielectric layer 113 from bottom electrode 109 in peripheral region 122. In embodiments represented by structure 110B, this is because bottom electrode 109 is absent beneath dielectric layer 113 in peripheral region 122. In both groups of embodiments, a shortest-distance path from top electrode 115 to bottom electrode 109 is not found in region 112 where dielectric layer 113 may be damaged by etching that forms edge 114.

Figure 5:
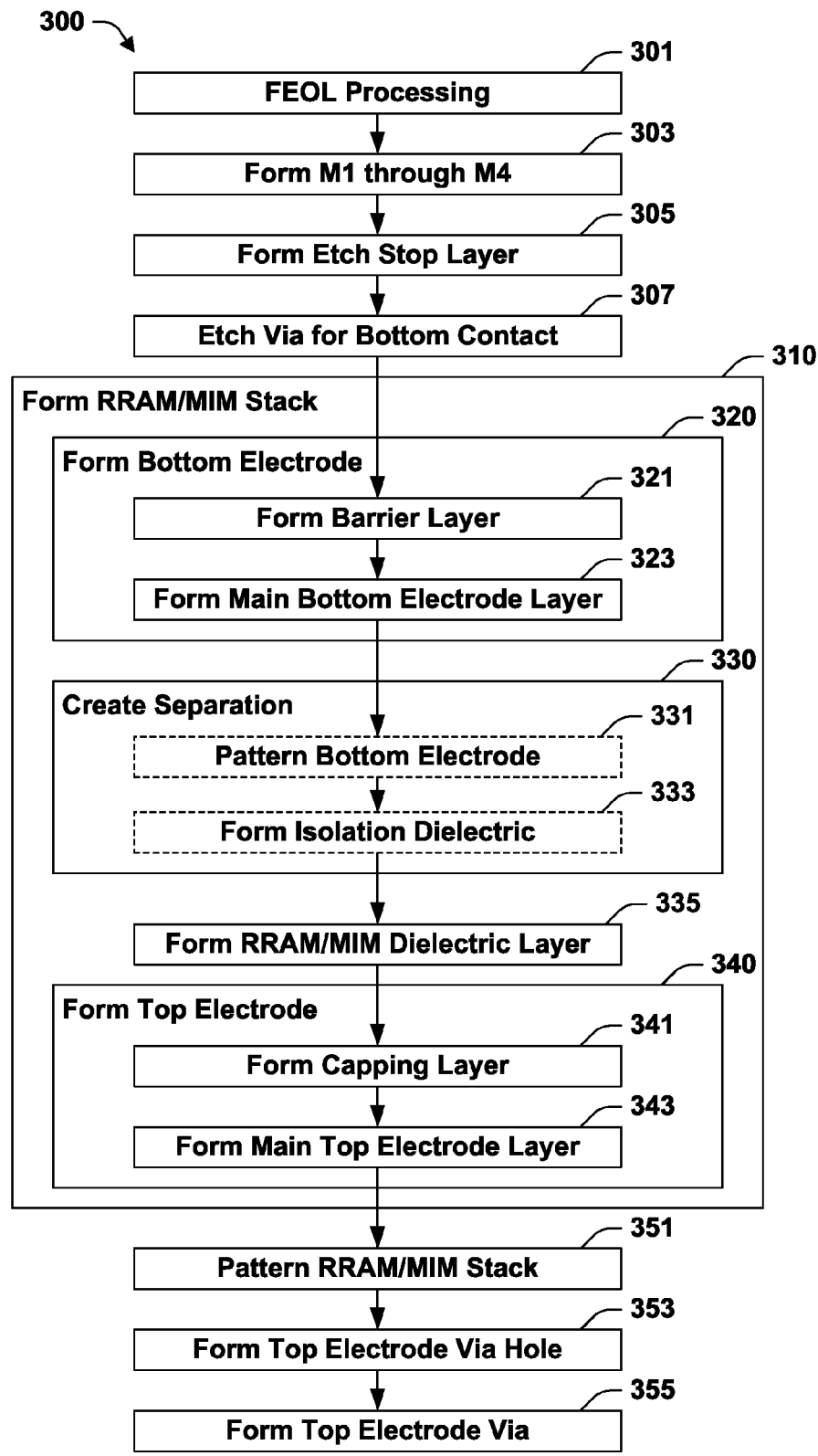
FIG. 5 is a flow chart of a method, which is an example in accordance with some embodiments of the present disclosure.

FIG. 5 provides a flow chart of a method 300, which is an example according to another embodiment of the present disclosure. The method 300 can be used to form the device 100 or the device 200. Some embodiments of manufacturing methods are described below with reference to FIGS. 6-15, which depict incremental manufacturing steps as a series of cross-sectional views. More particularly FIGS. 6-11 show one manufacturing methodology embodiment for manufacturing device 200 while FIGS. 12-15 show another manufacturing embodiment for manufacturing device 100.

Figure 6:
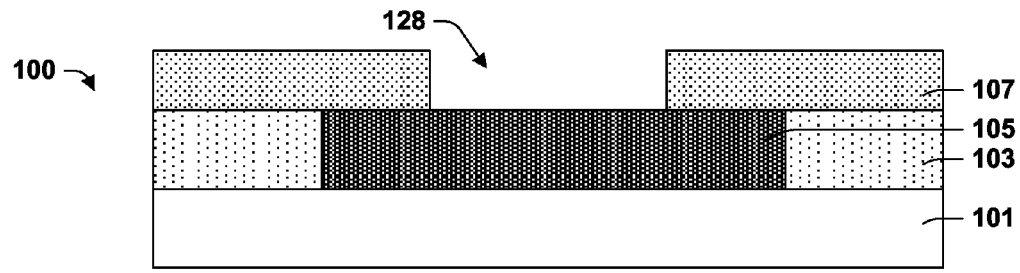
FIGS. 6 and 7A illustrate a device, which can be the device of FIG. 1 or the device of FIG. 3, as it begins manufacture according to the process of FIG. 5.

In FIG. 6, process 300 begins with optional acts of completing front-end-of-line (FEOL) processing (FIG. 5, act 301 and act 303) in which first (M1) through fourth (M4), contact 105, and dielectric layer 103 are formed. An etch stop layer 107 is then formed over the metal interconnect layer on substrate 101 (FIG. 5, act 305) and a hole 128 is formed through etch stop layer 107 to expose contact 105 as show in FIG. 6.

Process 300 continues with a series of acts 310 that form RRAM/MIM stack 130 (RRAM/MIM stack 130A or RRAM/MIM stack 130B). An example of how this RRAM/MIM stack 130A is now described below.

Figure 7A:
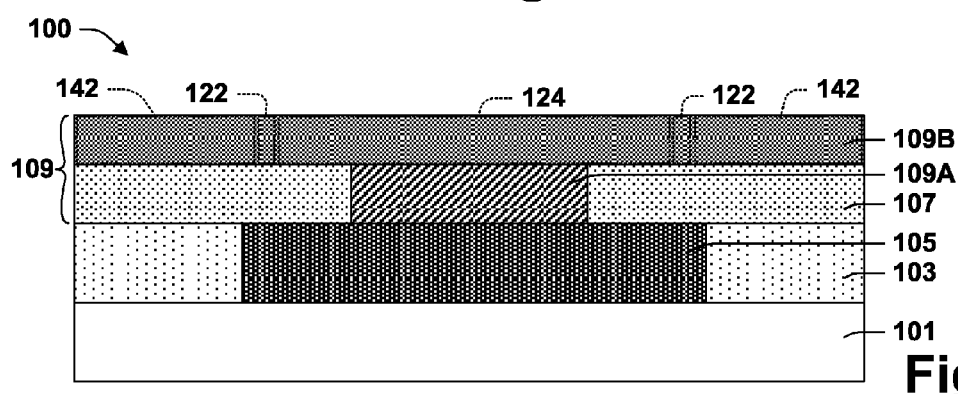
Figure 7B:
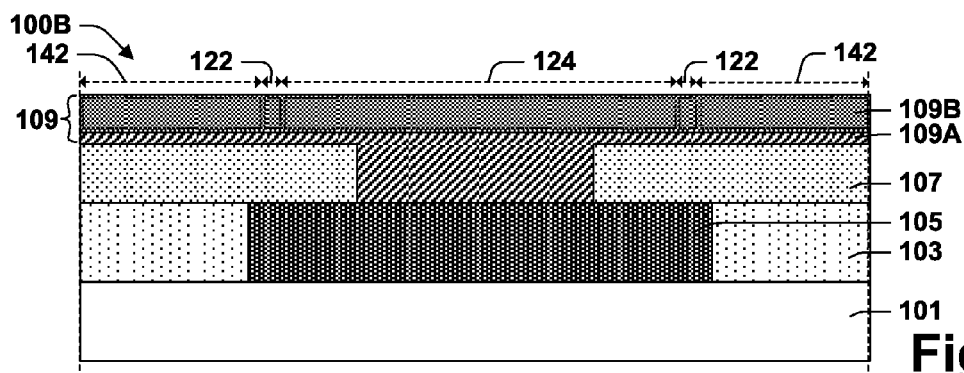
FIGS. 7B-7C illustrate alternative structures for the bottom electrode and provide alternative embodiments within either the group of embodiments represented by the device of FIG. 1 or the group of embodiments represented by the device of FIG. 3.
Figure 7C:
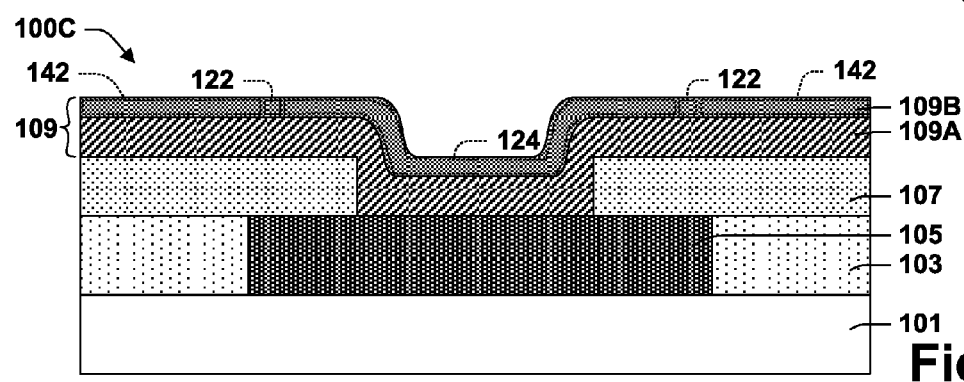

FIGS. 7A-7C shows several different ways to form bottom electrode 109 (FIG. 5, act 320), which can include one or more layers. For example, in the illustrated embodiments of FIGS. 7A-7C, a diffusion barrier layer 109A can be formed (FIG. 5, act 321), and a main bottom electrode layer 109B is then formed thereover (FIG. 5, act 323). Diffusion barrier layer 109A can be included to prevent contamination of main bottom electrode layer 109B by material from underlying contact 105. In some embodiments contact 105 is copper and diffusion barrier layer 109A is a material TiN for example, that provides an effective barrier to copper diffusion. In general, diffusion barrier layer 109A can have any suitable composition. In most embodiments, diffusion barrier layer 109A is a conductive oxide, nitride, or oxynitride of a metal selected from the group consisting of Al, Mn, Co, Ti, Ta, W, Ni, Sn, Mg, and combinations thereof. Diffusion barrier layer 109A can have any suitable thickness. A suitable thickness is large enough to provide an effective diffusion barrier while not being so large as to cause excessive resistance. In most embodiments, the thickness of diffusion barrier layer 109A is in the range from 20 Å to 300 Å. In some embodiments, the thickness of diffusion barrier layer 109A is in the range from 100 Å to 300 Å, for example, 200 Å.

Main bottom electrode layer 109B can have any suitable composition. Examples of compositions that can be suitable include, without limitation, metals, metal nitrides, and doped polysilicon. In some embodiments, bottom electrode layer 109B is a metal. The metal can be, for example, Al, Ti, Ta, Au, Pt, W, Ni, Ir, Cu, or a combination thereof. In some embodiments, bottom electrode layer 109B is a metal nitride. The metal nitride can be, for example, TaN. In some embodiments, bottom electrode layer 109B is a doped polysilicon. A doped polysilicon can be either a p+ doped polysilicon or an n+ doped polysilicon. In most embodiments, the thickness of bottom electrode layer 109B is in the range from 20 Å to 200 Å. In some embodiments, the thickness of bottom electrode layer 109B is in the range from 50 Å to 150 Å, for example, 100 Å.

The bottom electrode layers 109A and 109B can be formed by any suitable processes. In FIG. 7A, for example, bottom electrode layer 109A is deposited (act 321, FIG. 5) to fill hole (FIG. 6, 128) and is then chemically mechanically polished down to etch stop layer 107, whereby bottom electrode layer 109A just fills hole 128. Main bottom electrode layer 109B is then deposited (act 323) to form a structure as shown in FIG. 7A. In FIG. 7B, CMP is not performed on the deposited diffusion barrier layer 109A (or CMP is performed, but for less time than in FIG. 7A), such that some remaining amount of diffusion barrier layer 109A is allowed to cover the surface of etch stop layer 107. In FIG. 7C, the layers of bottom electrode 109 conform to the surface over which they are deposited. In this later situation, the shapes of all layers in RRAM/MIM stack 130 are affected by the shape of hole 128 over which the RRAM/MIM stack 130 is formed. Any of the structures as shown in FIGS. 7A-7C can be used in conjunction with embodiments exemplified by device 100 of FIGS. 1 and 2 or device 200 of FIGS. 3 and 4.

Figure 8:
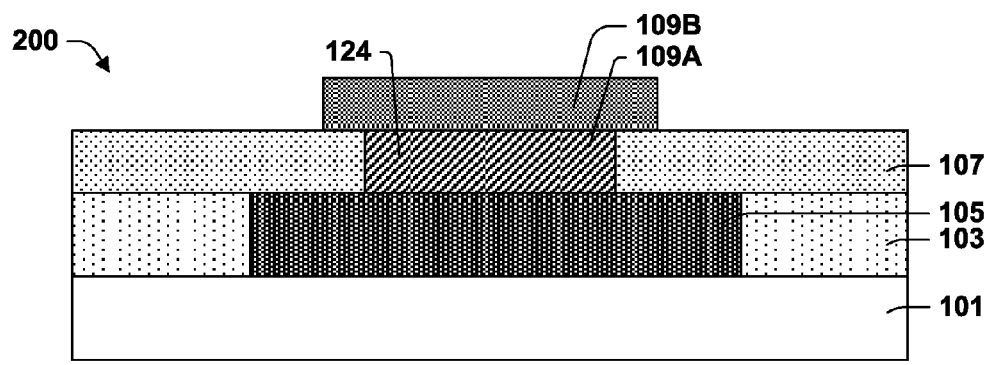
FIGS. 8 to 11 illustrate the device of FIG. 1 as it undergoes further processing according to the method of FIG. 5.

FIGS. 8-11 illustrate intermediate stages of device 200 as one or more acts 330 that create separation between peripheral top electrode region 115 and peripheral bottom electrode region 109. These can include either or both of act 331, patterning to remove bottom electrode 109 from peripheral region 122, and act 333, forming additional dielectric layer 111 and patterning to remove a portion of additional dielectric layer 111 lying within central region 124. Act 331 results in devices such as device 200 illustrated by FIGS. 3-4. FIGS. 8-11 illustrate intermediate stages of device 200 as it undergoes manufacture by the process 300 when act 331 is employed. FIG. 8 (act 331, FIG. 5, patterning to remove bottom electrode 109 from peripheral region 122 and outer region 142), generally includes photolithography to form a mask (not shown) that covers central bottom electrode 124 while exposing peripheral bottom electrode region 122 and outer bottom electrode region 142. With this mask in place, an etch is performed to remove the exposed peripheral and outer bottom electrode regions 122, 142. The mask is then stripped to form a structure as shown in FIG. 8, in which only the central bottom electrode region 124 remains in place. In most embodiments, the etch can include dry and/or wet etching for which etch stop layer 107 provides an etch stop. The dry etch can be, for example, a plasma etch using a fluorine-based gas or Ar. The wet etch can be, for example, a wet etch using HF or a similar acid.

Figure 9:
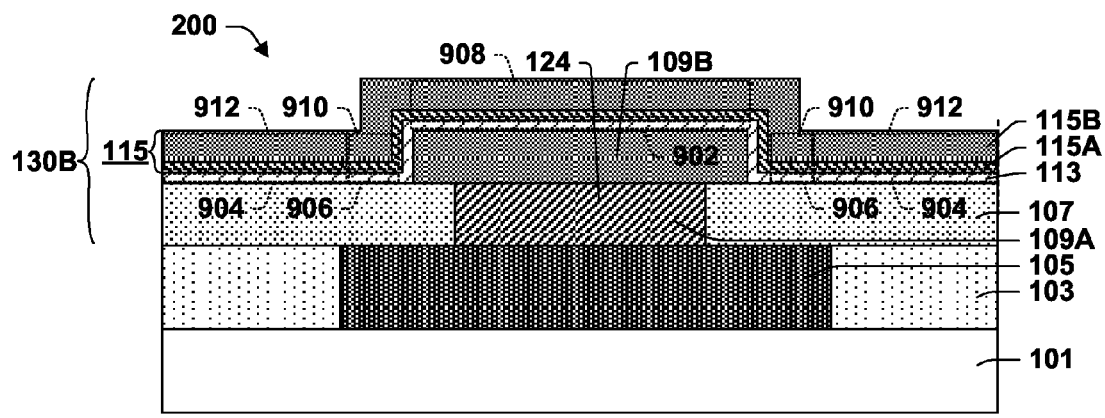

In FIG. 9 an RRAM dielectric layer 113 is formed (act 335, FIG. 5), and a top electrode 115 is formed thereover (acts 340, FIG. 5). The dielectric layer 113, which can be referred to in some embodiments as a first dielectric layer, includes a central dielectric region 902 that is in direct contact with at least an upper surface of the bottom electrode layer 109B. The dielectric layer 113 also includes an outer dielectric region 904 spaced apart from the bottom electrode layers 109, and a peripheral dielectric region 906 connecting the central and outer dielectric regions. The peripheral dielectric region 906 is spaced apart from the bottom electrode layers 109.

In RRAM device embodiments, dielectric 113 can be any material suitable for the data storage layer of an RRAM cell. A material suitable for the data storage layer of an RRAM cell is one that can be induced to undergo a reversible phase change between a high resistance state and a low resistance state. In some embodiments, the phase change is between an amorphous state and a metallic state. The phase change can be accompanied by or associated with a change in chemical composition. For example, an amorphous metal oxide may lose oxygen as it undergoes a phase change to a metallic state. The oxygen may be stored in a portion of dielectric 113 that remains in the amorphous state or in an adjacent layer, especially capping layer 115A. Although described as a dielectric, only the low resistance state need be a dielectric. In most RRAM embodiments, dielectric 113 is a high-k dielectric while in the low resistance state. In some RRAM embodiments, dielectric 113 is a transitional metal oxide. Examples of high-k dielectric materials that can be suitable for dielectric 113 in RRAM devices include, without limitation, $NiO_x$, $Ta_yO_x$, $TiO_x$, $HfO_x$, $Ta_yO_x$, $WO_x$, $ZrO_x$, $Al_yO_x$, $SrTiO_x$ and combinations thereof. In most RRAM embodiments, the thickness of dielectric 113 is in the range from 20 Å to 100 Å. In some RRAM embodiments, the thickness of dielectric 113 is in the range from 30 Å to 70 Å, for example, 50 Å.

In MIM capacitor embodiments, dielectric 113 can be any material suitable for the insulating layer of an MIM capacitor. In some MIM capacitor embodiments, dielectric layer 113 is silicon oxynitride or silicon nitride. In most MIM capacitor embodiments, dielectric layer 113 is a high-k dielectric. In some MIM capacitor embodiments, dielectric layer 113 is a hafnium compound. Examples of hafnium compounds include hafnium oxide (HfOZ), hafnium silicon oxide (HfSiO), hafnium silicon oxynitride, (HfSiON), hafnium tantalum oxide (HfTaO), hafnium titanium oxide (HfTiO), hafnium Zirconium oxide (HfZrO), and combinations thereof. Dielectric layer 113 can include multiple layers of various dielectrics. In most MIM capacitor embodiments, the thickness of dielectric 113 is in the range from 50 Å to 300 Å. In some MIM capacitor embodiments, especially those in which dielectric 113 is a high-k dielectric, the thickness of dielectric 113 is in the range from 50 Å to 100 Å.

When dielectric layer 113 is formed over a bottom electrode 109 shaped as illustrated for the device 100C shown in FIG. 7C, it is possible that a deposition process will result in dielectric layer 113 being slightly thicker in peripheral region 222 as compared to a minimum thickness of dielectric layer 113 occurring in central region 224. A slightly greater separation between bottom electrode 109 and top electrode 115 in peripheral region 222 resulting solely from that thickness variation would not be considered substantial as that term is used in the present disclosure. By contrast, the difference in separation resulting from either act 331 or act 333 would be considered substantial.

As shown in FIG. 9, top electrode 115 when initially formed includes a central top electrode region 908, a peripheral top electrode region 910, and an outer top electrode region 912 Top electrode 115 can include one or more layers. Top electrode 115 includes a main top electrode layer 115B of conductive material. In some embodiments, especially the RRAM embodiments, top electrode 115 also includes capping layer 115A. For RRAM embodiments, capping layer 115A can provide an oxygen storage function that facilitates the setting and resetting of the RRAM cell formed by metal-insulator-metal structure 110.

Capping layer 115A can have any suitable composition. In some RRAM embodiments, capping layer 115A is a metal or a metal oxide that is relatively low in oxygen concentration. Examples of metals that can be suitable for capping layer 115A in RRAM embodiments include Ti, Hf, Pt, Al or a combination thereof. Examples of metal oxides that can be suitable for capping layer 115A include $TiO_x$, $HfO_x$, $ZrO_x$, $GeO_x$, $CeO_x$, or a combination thereof. Capping layer 115A can have any suitable thickness. In most RRAM embodiments, the thickness of capping layer 115A is in the range from 20 Å to 100 Å. In some RRAM embodiments, the thickness of capping layer 115A is in the range from 30 Å to 70 Å, for example, 50 Å.

Main top electrode layer 115B can have any of the compositions identified as suitable for main bottom electrode layer 109B. Top electrode layer 115B can have any suitable thickness. In most embodiments, the thickness of top electrode layer 115B is in the range from 100 Å to 400 Å. In some embodiments, the thickness of top electrode layer 115B is in the range from 150 Å to 300 Å, for example 250 Å.

Figure 10:
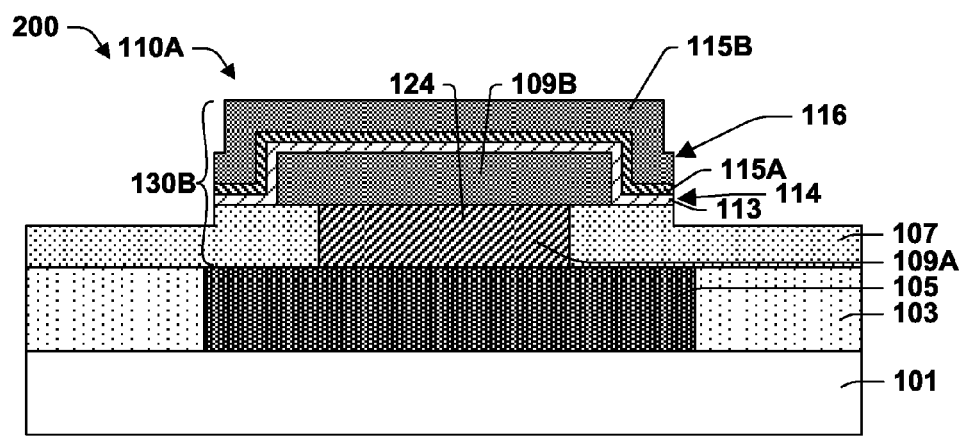

In FIG. 10, the RRAM/MIM stack is patterned to form metal-insulator-metal structure 110A (act 351, FIG. 5). To form the structure of FIG. 10, photolithography is typically used to form a mask (not shown) over the top electrode layer 115B. This mask exposes outer top electrode regions 912, while covering the central and peripheral top electrode regions 908, 910. With the mask in place, an etch process (Act 351, FIG. 5) etches through at least top electrode layers 115 and dielectric layer 113 and removes the outer top electrode regions 912 and outer dielectric regions 904, while leaving the central and peripheral top electrode and dielectric regions (902, 906, 908, 910) in place. In most embodiments, the etch is a plasma etch for which etch stop layer 107 provides an etch stop. The etch can be carried out in one or more stages to etch through the various layer of RRAM/MIM stack 130. The individual stages can be, for example, plasma etches based on one or more of $Cl_2$, $BCl_2$, Ar, and F. In most embodiments, act 351 uses a single mask.

Figure 14:
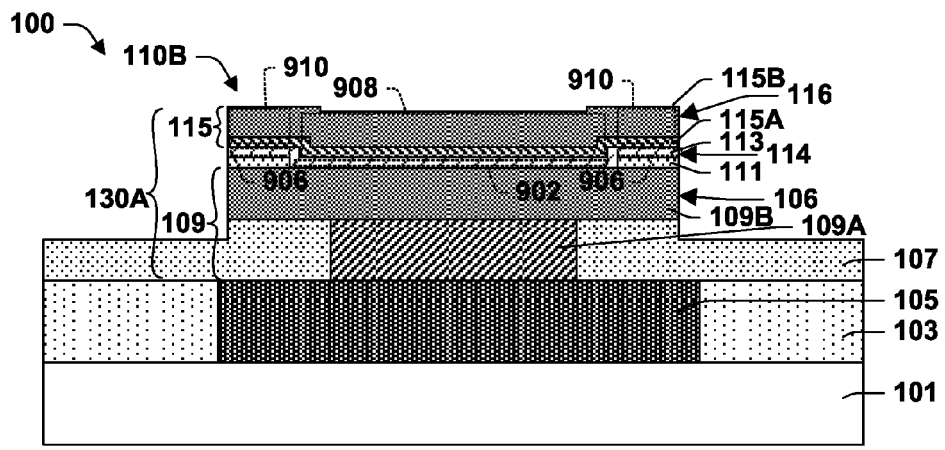
Figure 15:
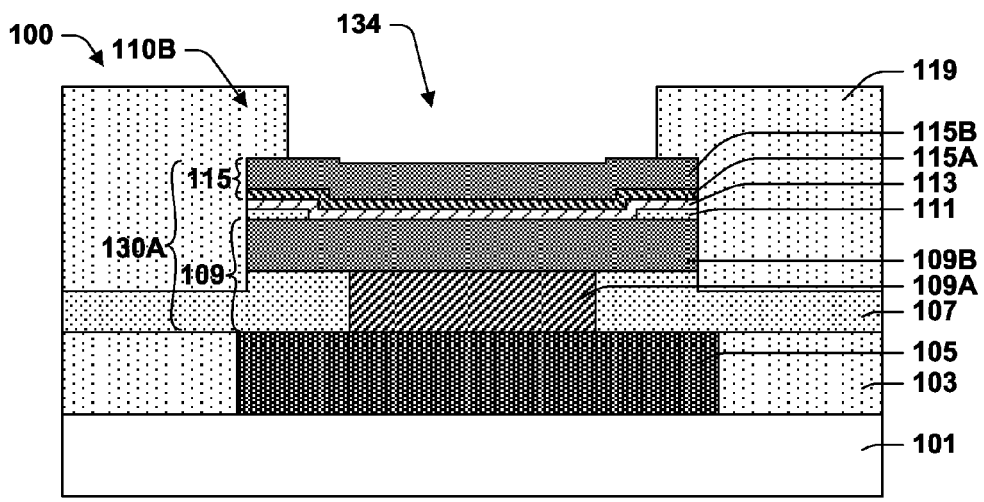

As shown in FIG. 10, for example, act 351 forms edge 116 of top electrode 115 and edge 114 of dielectric layer 113. In most embodiments, act 351 leaves edge 116 and edge 114 flush as shown in FIGS. 2 and 4. Edges 114 and 116 are at the periphery of metal-insulator-metal structure 110, abut peripheral region 122, and are distal to central region 124. Capping layer 115A may be damaged or contaminated near edge 116. Dielectric layer 113 may be damaged or contaminated near edge 114. Any such damage or contamination does not affect the performance of metal-insulator-metal structure 110 provided by the present disclosure. In some embodiments, act 351 includes etching through bottom electrode 109 and leaves an edge 106 of bottom electrode 109 also flush with edge 114 of dielectric 113 as shown in FIG. 14.

Figure 11:
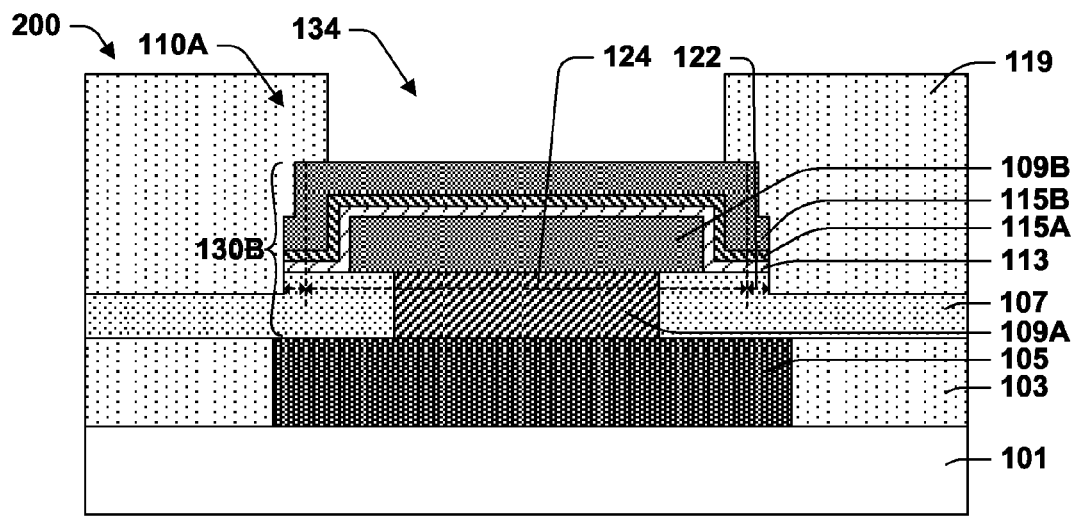

Process 300 continues with acts that encapsulate metal-insulator-metal structures 110 in dielectric 119 and form a top electrode via 125 for connecting metal-insulator-metal structures 110 to bit lines (not shown) or the like. Act 353 deposits dielectric 119. Act 355 forms an opening 134 in dielectric 119 as shown in FIG. 11 for device 200 and FIG. 15 for device 100. Act 357 fills opening 134 with conductive material to form via 125 resulting in a structure as shown in FIG. 1 for device 100 and FIG. 3 for device 200. In most embodiments, dielectric 119 is a low-k dielectric. In some embodiments, dielectric 119 is an extremely low-k dielectric. Via 125 can be formed from any suitable conductor. In some embodiments, via 125 is copper.

FIGS. 12-15 illustrate an alternate manufacturing embodiment to form devices such as device 100 illustrated in FIGS. 1-2. Many acts in manufacturing device 100 are the same as described above with regards to manufacturing device 200, and are therefore not repeated for purposes of clarity and conciseness. Act 333 of FIG. 5 is present, however, and was not previously described in FIGS. 6-11. FIGS. 12-15 illustrate intermediate stages of device 100 as it undergoes manufacture by the process 300 when act 333 is employed.

Figure 12:
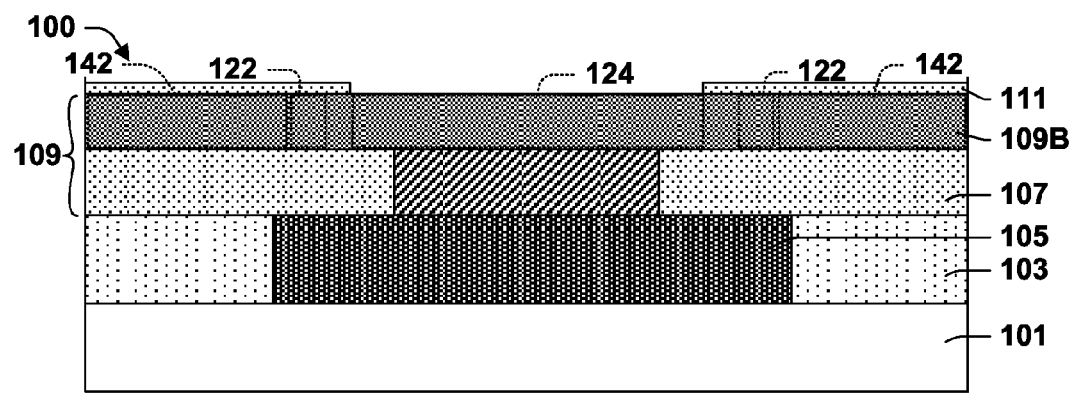
FIGS. 12 to 15 illustrate the device of FIG. 3 as it undergoes further processing according to the method of FIG. 5.

In FIG. 12 (Act 333, forming additional dielectric layer 111), generally includes photolithography to form a mask (not shown) that exposes a central region of additional dielectric layer 111, while covering peripheral and outer regions of the additional dielectric layer 111. An etch is carried out with the mask in place to remove the exposed central portion of additional dielectric layer 111, and the mask is then stripped to form a structure as shown in FIG. 12. As shown in FIG. 12, act 333 leaves peripheral dielectric region 122 and outer dielectric region 142. Additional dielectric layer 111 can have any suitable composition and can be formed by any suitable process. Examples of suitable compositions for additional dielectric layer 111 include, without limitation, $SiO_2$, SiN, and SiON.

Figure 13:
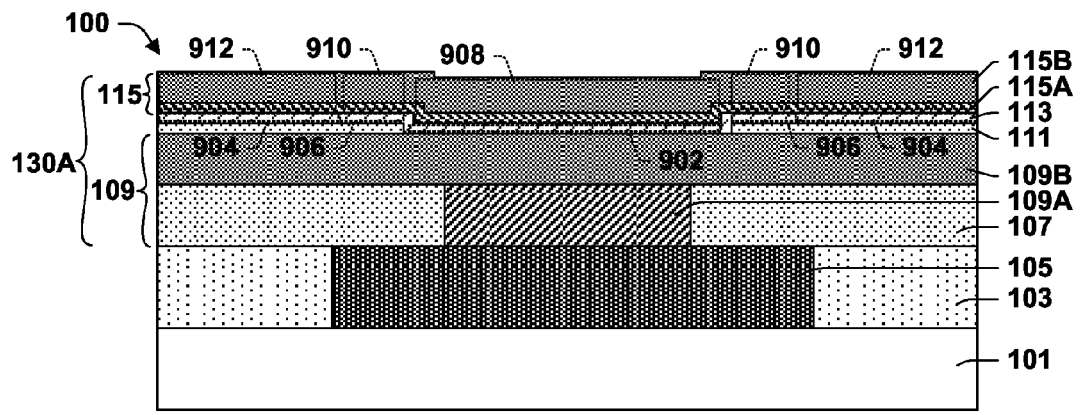

Additional dielectric layer 111 can have any suitable thickness. Additional dielectric layer 111 is sufficiently thick to perform its function but is generally not so thick as to excessively increase the height of RRAM/MIM stack 130A. In most embodiments, the thickness of additional dielectric layer 111 is in the range from 10 Å to 200 Å. In some embodiments, the thickness of additional dielectric layer 111 is in the range from 20 Å to 100 Å, for example, 50 Å. As shown in FIGS. 13-14, a MIM/RRAM dielectric 113 and top electrode layers 115 are then conformally formed over the dielectric layer. Etching is then performed to remove outer regions of the layers while leaving peripheral and central regions in place, as shown in FIG. 14.

The present disclosure provides an integrated circuit device that includes a metal-insulator-metal structure. The structure can form a resistive random access memory (RRAM) cell or an MIM capacitor. The metal-insulator-metal structure includes a dielectric layer between a top conductive layer and a bottom conductive layer. The dielectric layer includes a peripheral region adjacent an edge of the dielectric layer where the dielectric layer has been cut off by etching and a central region surrounded by the peripheral region. The top conductive layer abuts and is above dielectric layer. The bottom conductive layer abuts and is below the dielectric layer in the central region. The bottom conductive layer does not abut the dielectric layer in the peripheral region of the dielectric layer.

This structure causes pathways between the top conductive layer and the bottom conductive layer to be substantially greater along pathways passing through the peripheral region of the dielectric layer in comparison to pathways passing through the central region. This inhibits formation of conductive bridges or leakage currents through areas of the dielectric layer that may have been damaged or contaminated by etching near the edge of the dielectric layer. In a first group of embodiments, the bottom conductive layer is prevented from abutting the dielectric in the peripheral region by an extra layer of dielectric in the peripheral region. In a second group of embodiments, the bottom conductive layer is prevented from abutting the dielectric in the peripheral region by cutting off the bottom conductive layer short of the peripheral region.

The present disclosure also provides an integrated circuit device that includes a metal-insulator-metal structure formed over the substrate. The metal-insulator-metal structure is either a resistive random access memory (RRAM) cell or an MIM capacitor. The metal-insulator-metal structure includes a bottom electrode, a first dielectric layer, and a top electrode. There is a minimum distance between the bottom electrode and the top electrode. The first dielectric layer is positioned between the bottom electrode and the top electrode where they are separated by the minimum distance. The bottom electrode and the top electrode are configured whereby the shortest path starting from a point on the perimeter of the top electrode and continuing to the bottom electrode is greater than the minimum distance. In a first group of embodiments, the distance between the electrodes is increased in the peripheral region by an extra layer of dielectric in the peripheral region. In a second group of embodiments, the distance between the electrodes is made greater in the peripheral region by the bottom electrode being cut off short of the peripheral region.

The present disclosure provides a method of manufacturing an integrated circuit device that includes forming a contact on a substrate and forming one or more bottom electrode layers directly over the contact. A first dielectric layer is formed over the one or more bottom electrode layers. The first dielectric layer includes a central dielectric region in direct contact with the bottom electrode layers, an outer dielectric region spaced apart from the bottom electrode layers, and a peripheral dielectric region that is also spaced apart from the bottom electrode layers. The peripheral dielectric region connects the central and outer dielectric regions. One or more top electrode layers is then conformally formed over the first dielectric layer. The one or more top electrode layers include a central top electrode region, an outer top electrode region, and a peripheral top electrode region. These are formed over the central dielectric region, the outer dielectric region, and the peripheral dielectric region, respectively. The one or more top electrode layers and the first dielectric layer are then patterned to form a cell having a patterned top electrode and a patterned first dielectric. The patterning removes the outer top electrode region and the outer dielectric region while leaving the central and peripheral top electrode regions and the central and peripheral dielectric regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a metal-insulator-metal structure including a first dielectric layer between a top conductive layer and a bottom conductive layer, wherein an outermost sidewall of the top conductive layer is aligned with an outermost sidewall of the bottom conductive layer;
   a capping layer separating the first dielectric layer from the top conductive layer, the capping layer having a composition that differs from the top conductive layer;
   a diffusion barrier layer under and contacting a bottom surface of the bottom conductive layer, wherein the diffusion barrier layer and the bottom conductive layer collectively have a T-shaped profile;
   wherein the first dielectric layer comprises:
      a peripheral region adjacent an edge of the first dielectric layer where the first dielectric layer has been cut off by etching; and
      a central region surrounded by the peripheral region;
   the top conductive layer abuts and is above the capping layer;
   the bottom conductive layer abuts and is below the central region of the first dielectric layer; and
   the bottom conductive layer does not abut the peripheral region of the first dielectric layer.

2. The integrated circuit device of claim 1, wherein the first dielectric layer and the top conductive layer are coextensive.

3. The integrated circuit device of claim 1, wherein an additional dielectric layer lies between the bottom conductive layer and the first dielectric layer in the peripheral region.

4. The integrated circuit device of claim 1, wherein the first dielectric layer is no thinner in the central region than in the peripheral region.

5. The integrated circuit device of claim 1, wherein the edge of the first dielectric layer is aligned with the outermost sidewalls of the top and bottom conductive layers.

6. The integrated circuit device of claim 1, wherein the diffusion barrier layer has a T-shaped profile independent of the bottom conductive layer.

7. The integrated circuit device of claim 1, further comprising:
   an etch stop layer having an upward protrusion culminating in a top surface of the etch stop layer that contacts the bottom surface of the bottom conductive layer, wherein the diffusion barrier layer extends through the etch stop layer to a bottom surface of the diffusion barrier layer that is even with a bottom surface of the etch stop layer.

8. The integrated circuit device of claim 7, wherein an outer sidewall of the etch stop layer is aligned with the outermost sidewall of the bottom conductive layer and extends between the top surface of the etch stop layer and a recessed surface of the etch stop layer, and wherein the integrated circuit device further comprises:
a conductive contact having a top surface under and contacting the bottom surfaces respectively of the diffusion barrier layer and the etch stop layer.

9. An integrated circuit device, comprising:
a substrate;
a metal-insulator-metal (MIM) structure formed over the substrate, the MIM structure being either a resistive random access memory (RRAM) cell or an MIM capacitor;
wherein the MIM structure includes a bottom electrode, a first dielectric layer, and a top electrode, wherein the bottom electrode has an outer sidewall which is aligned with an outer sidewall of the top electrode, wherein the top electrode includes a conductive capping layer over the first dielectric layer and a conductive main electrode layer conformally overlying the conductive capping layer, and wherein outer sidewalls respectively of the conductive capping layer and the conductive main electrode layer are aligned with the outer sidewall of the bottom electrode;
the bottom electrode and the top electrode are spaced apart from one another by different vertical distances for different locations across the bottom electrode;
the first dielectric layer is positioned between the bottom electrode and the top electrode where the top and bottom electrodes are separated by a minimum vertical distance; and
the bottom electrode and the top electrode are configured whereby a shortest path starting from any point on a perimeter of the top electrode and continuing to the bottom electrode is greater than the minimum vertical distance.

10. The integrated circuit device of claim 9, wherein the shortest path starting from a point on the perimeter of the top electrode and continuing to the bottom electrode passes through a second layer of dielectric that is not present on the shortest path from the top electrode to the bottom electrode.

11. The integrated circuit device of claim 9, wherein the bottom electrode has a first width between outer sidewalls of the bottom electrode, and the top electrode has a second width between outer sidewalls of the top electrode, the first width and second width being equal.

12. The integrated circuit device of claim 9, further comprising:
an etch stop layer contacting a bottom surface of the bottom electrode, wherein the etch stop layer includes an opening under a central region of the bottom electrode; and
a conductive diffusion barrier layer disposed in the opening and electrically coupling the central region of the bottom electrode to an underlying contact, wherein the conductive diffusion barrier layer is a different material than the bottom electrode and the underlying contact.

13. The integrated circuit device of claim 9, wherein the conductive main electrode layer is in direct contact with an upper surface of the conductive capping layer, and wherein the conductive main electrode layer has a different composition than the conductive capping layer.

14. The integrated circuit device of claim 13, wherein the conductive main electrode layer includes a metal component, and wherein the conductive capping layer includes a metal oxide which includes the metal component.

15. A metal-insulator-metal device, comprising:
a bottom metal electrode including a central bottom electrode region which is laterally surrounded by a peripheral bottom electrode region;
a top metal electrode including a conductive capping layer and a conductive main electrode layer conformally overlying the conductive capping layer, the top metal electrode having a central top electrode region which is arranged over the central bottom electrode region and which is laterally surrounded by a peripheral top electrode region arranged over the peripheral bottom electrode region, wherein a sidewall of the peripheral top electrode region is aligned with a sidewall of the peripheral bottom electrode region, wherein a first vertical distance separates the central bottom electrode region from the central top electrode region and a second vertical distance separates the peripheral bottom electrode region from the peripheral top electrode region, the second vertical distance being greater than the first vertical distance;
an etch stop layer under the bottom metal electrode, wherein the bottom metal electrode overhangs and contacts a top surface of the etch stop layer, and protrudes through the etch stop layer to a bottom surface of the bottom metal electrode that is even with a bottom surface of the etch stop layer;
a first dielectric layer covering an upper surface of the peripheral bottom electrode region without extending over the central bottom electrode region; and
a second dielectric layer extending over the first dielectric layer and extending over the central bottom electrode region to separate the bottom metal electrode from the top metal electrode.

16. The metal-insulator-metal device of claim 15, wherein an upper surface of the bottom metal electrode is continuously planar over the peripheral bottom electrode region and central bottom electrode region.

17. The metal-insulator-metal device of claim 15, wherein a lower surface of the central top electrode region is stepped relative to a lower surface of the peripheral top electrode region, such that the lower surface of the central top electrode region meets the lower surface of the peripheral top electrode region at a sidewall.

18. The metal-insulator-metal device of claim 15, wherein the bottom metal electrode has a different cross-sectional shape than the top metal electrode.

19. The metal-insulator-metal device of claim 15, wherein the conductive capping layer abuts the second dielectric layer and has contours that follow those of the second dielectric layer; and
the conductive main electrode layer is arranged over the capping layer, the conductive main electrode layer having a different composition than the capping layer and having a thickness that is greater than that of the capping layer.

20. The metal-insulator-metal device of claim 15, wherein the conductive main electrode layer contacts the conductive capping layer and comprises a recess, and wherein the metal-insulator-metal device comprises:
a conductive via over the conductive main electrode layer, wherein the conductive via completely fills the recess; and a conductive contact under and contacting the bottom surface of the bottom metal electrode and the bottom surface of the etch stop layer.

\* \* \* \* \*